United States Patent [19]

Stone

[11] Patent Number: 4,978,560
[45] Date of Patent: Dec. 18, 1990

[54] HOT ROLL GLOSSER METHOD WITH GLOSSING TEMPERATURE BELOW FREE AIR GLASS TRANSISTION TEMPERATURE OF RESIN UTILIZED

[75] Inventor: Benjamin C. Stone, Alpha, Ohio

[73] Assignee: The Mead Corporation, Dayton, Ohio

[21] Appl. No.: 483,155

[22] Filed: Feb. 22, 1990

Related U.S. Application Data

[63] Continuation-in-part of Ser. No. 379,459, Jul. 13, 1989, abandoned.

[51] Int. Cl.$^5$ .............................................. B05D 3/12
[52] U.S. Cl. ................................ 427/366; 427/385.5; 427/194; 162/136; 100/93 RP; 118/60; 118/116
[58] Field of Search ...................... 427/366, 385.5, 160, 427/194; 118/60, 116; 162/136; 29/527.2; 100/93 RP

[56] References Cited

U.S. PATENT DOCUMENTS

| | | | |
|---|---|---|---|
| 2,555,663 | 5/1951 | Cowgill | 427/361 |
| 3,732,121 | 5/1973 | Long | 427/366 X |
| 3,873,345 | 3/1975 | Vreeland | 428/514 |
| 4,112,192 | 9/1978 | Vreeland | 427/391 X |
| 4,241,143 | 12/1980 | Ashie et al. | 427/366 X |
| 4,277,524 | 7/1981 | Nakajima et al. | 118/60 X |
| 4,290,691 | 9/1981 | Giorgini | 355/3 FU |
| 4,368,240 | 1/1983 | Nauta et al. | 428/447 |
| 4,624,744 | 11/1986 | Vreeland | 427/366 X |
| 4,807,560 | 2/1989 | Stone et al. | 118/666 |
| 4,809,599 | 3/1989 | Kawada et al. | 118/116 X |

OTHER PUBLICATIONS

Research Disclosure Article 27660, published Apr. 1987, "Hot Roller Fixture for Glossing", The Mead Corporation.

Primary Examiner—Shrive P. Beck
Assistant Examiner—Alain Bashore
Attorney, Agent, or Firm—Biebel, French & Nauman

[57] ABSTRACT

A hot roll glosser and method for the transparentising of resin-coated microencapsulated media includes a pair of heated pressing rolls, in which the roll which comes into contact with a resin surface is formed with an ultrasmooth silicone surface of low furface energy, and the glossing temperature of the rolls at the pressing nip is maintained below the glass transition temperature of the resin. Take-off rolls are disclosed for maintaining a tension in the web material exiting the nip to maintain a negative exit angle with respect to the silicone roll and to prevent adhesion and sticking to the roll.

3 Claims, 2 Drawing Sheets

HOT ROLL GLOSSER METHOD WITH GLOSSING TEMPERATURE BELOW FREE AIR GLASS TRANSISTION TEMPERATURE OF RESIN UTILIZED

RELATED APPLICATION

This application is a Continuation-In-Part of application Ser. No. 379,459 filed July 13, 1989 now abandoned.

BACKGROUND OF THE INVENTION

This invention relates to the glossing of thermoplastic resins on microencapsulated receiver sheets as disclosed in the commonly assigned U.S. Pat. Nos. 4,399,209 and 4,416,966.

The art of glossing polymer resins on substrate sheets is discussed in Cowgill, U.S. Pat. No. 2,554,663 issued May 29, 1951. Cowgill described the glossing of such resins in terms of the second order transition temperature of the resin ($T_2$), also known as the glass transition temperature ($T_9$). The second order transition temperature as defined by Cowgill is that temperature at which the amorphous thermoplastic resin material changes from a two dimensional liquid to a three dimensional liquid. At this point the resin is said to begin to flow more readily as the temperature is increased. As the temperature is increased, the viscosity goes down and the tackiness of the material increases.

Cowgill believed that the setting of the coating by heating to a temperature well above the second order transition temperature was essential in order to obtain satisfactory glossing. Cowgill also showed that the addition of a plasticizer could be used to lower the spread between the second order transition temperature $T_2$ and the actual glossing temperature, and suggested an oven for preheating the resin to a given temperature above $T_2$, and a roll-type casting apparatus including a heated mirror finish roll against which the web is pressed face down and wrapped about 180° and then peeled off face up and cooled. The mirror finish roll was maintained at a temperature above the glass transition temperature, by an actual amount dependent upon the amount of plasticizer employed.

Cowgill's investigation also showed that it was possible to reduce the glossing temperature with increased pressure at the nip of the pressure rolls, but that the decrease in glossing temperature as the pressure was increased from 200 to 1,500 psi only amounted to approximately 10° C., where the s, ting temperature was already 40° C. above $T_2$.

With respect to the resin-coated receiver sheets of the kinds described in the above-identified commonly owned patents, it has been found that coalescing resin coating improves the perceived image quality by increasing color saturation. While Cowgill was primarily interested in coating paper stock such as may be used in the manufacture of cartons and the like, and employed primarily a resin copolymer of styrene and butadiene, current technology prefers the use of vinyl polymers and copolymers as disclosed in commonly assigned copending application Ser. No. 086,059 filed Aug. 14, 1987 now U.S Pat. No. 4,877,767, or phenolic resins as disclosed in commonly assigned copending application Ser. No. 073,036 filed July 14, 1987 now U.S. Pat. No. 4,859,651. Such phenolic resins may be metallated to improve their characteristics, and plasticizers may be employed to lower the glass transition temperature and to improve surface quality.

Such resins as currently used are obtained in a dispersed form and are roll and/or blade coated. Commonly the resin is finely ground or finely divided and dispersed in a carrier oil, and the resulting coating on the substrate, has a rather opaque, white, or milky appearance. In the processing or glossing stage, it is necessary to transparentize this coating and provide thereon a suitable smooth high gloss surface condition.

The milky or opaque appearance of the coating, prior to transparentizing, is believed to be due to the reflection and refract on of light at the uneven surface, and additionally due to the breaking up of the light at the interfaces between the carrier and the dispersed particles. The latter may be viewed as small globules or spheres of particles under a microscope at between 200 and 500 power magnification.

The copolymer has a glass transition temperature $T_9$ or range in which the coating constituents, each having approximately the same index of refraction, coalesce into a common surface where the individual parts can no longer be visually or optically distinguished, and one which has a minimum of residual haze and a maximum of gloss, as may be measured on a conventional gloss meter.

Substantial efforts have been expended to find glossing apparatus and methods which are compatible with the microencapsulated system, and which can provide satisfactory glossing at a throughput rate compatible with sheet development. At the present time, this rate is considered to be at least 10 ppm (pages per minute) for paper substrate and 5 ppm for overhead projection substrate (based on $8\frac{1}{2} \times 11$ inch paper). Such investigations have included the evaluation of hot roll as well as heated platen type glossing apparatus, and the commonly assigned U.S. Pat. No. of Stone et al, 4,807,560 issued Feb. 28, 1989 discloses and claims satisfactory developer sheet glossing apparatus employing a heated arched plate and a casting belt.

At the same time, heated roll-type glossing apparatus was investigated, but as stated in U.S. Pat. No. 4,807,560, less than satisfactory results were obtained. A principal drawback was the tendency of the heated resin to adhere to the hot rollers. Such adhesion not only causes misfeeds, but also causes degradation to the image and surface.

In connection with the investigation, it was discovered that the portions of the sheet being glossed having the lowest image density were those portions which required the highest glossing temperature. The reason for this phenomena is not fully understood, but it is believed that the dye precursor and oil released from the ruptured microcapsules may assist as a plasticizer in the film-forming characteristics of the resin. Such dye precursor and/or oil is much more abundant in the dense or darker areas than in the areas of minimum density. Therefore, it has been necessary to adjust the glossing temperature in accordance with the most difficult areas to be glossed, namely, those of minimum density. This is further exacerbated by the sticking problem when attempting to use roll-type glossers. One reason why the heated arched plate glosser of the above-identified patent was successful was due to the fact that the resin surface was formed by the surface of belt and not the plate, and was subsequently peeled off the belt.

The apparatus employed in the tests of the heated roll glosser was published in April 1987 in Article No. 27660 in Research Disclosure, Emsworth Studios Inc., 260 West 39th Street, New York, N.Y. 10018.

High temperature and high pressure roll-type glossing of latex coated pigment and latex coated paper stock is shown in Vreeland, U.S. Pat. No. 3,873,345 issued Mar. 25, 1975 and Vreeland divisional Pat. No. 4,112,192 issued Sept. 5, 1978. These prior art disclosures also describe the glass transition temperature phenomena $T_9$ and employ a hot steel roll in the gloss calendar which is maintained at a temperature in excess of $T_9$, and at a substantial nip pressure such as 400 pli (lbs. per linear inch). Since mineral pigmented coatings were employed, the transparentizing of the coating was not a necessary objective, and the results were measured in terms of surface gloss. Vreeland, U.S. Pat. No. 4,624,744 issued Nov. 25, 1986 further discloses the calendering of uncoated papers under heat and pressure to provide a surface gloss, using a drum surface in excess of the glass transition temperature of the uncoated cellulose paper fibers.

Very smooth and high gloss skins of silicone rubber have been applied to rolls for the calendering of synthetic resin materials, and the rolls have been manufactured as disclosed in Nauta et al, U.S. Pat. No. 4,368,240 issued Jan. 11, 1983. The rolls as made in this reference were used in the smoothing and calendering of webs formed of synthetic thermoplastic material.

SUMMARY OF THE INVENTION

The applicant has found that a two-roll or nip-forming roll type transparentizer may be satisfactorily used to transparentize coatings as described in the above-identified co-pending applications in which the resin contacting roll has a super fine high gloss, a low energy surface, and in which the resin material in the nip is elevated to a temperature ($T_9$) less than the free air glass transition temperature of the resin composite. It is believed that prior efforts to use roll-type heated glossers with the combination of materials as defined were unsuccessful because prior art teachings were followed which dictated the use of roll temperatures in excess of $T_9$ and further by reason of the failure to recognize that an extremely low energy, high gloss roll surface can be used to transparentize such material at a surface temperature less than $T_9$.

Energy of a surface is a measure of its wettability. A liquid, resting on a low energy surface, subtends the surface at a low angle since the drop of liquid tends to spread. On the other hand, a surface with low surface energy supports the liquid, such as a drop of water, almost as a bead, and the angle subtended between the bead and the surface is much higher as an indication of low surface energy.

The terms "surface energy" and "low surface energy" refer to the solid-vapor interface energy of a stable configuration of a liquid placed on the solid smooth surface of the roll. This energy may be expressed in dynes per centimeter. In such instances, the equilibrium shape of a liquid drop conforms to the minimum total surface and interface energy for all the phase boundaries present.

The angle between the solid surface and a tangent to the liquid surface, at the contact point, can vary between 0° and 180°. If the solid-vapor interface energy is high, the liquid will tend to spread out indefinitely to eliminate the interface, and if low, the liquid tends to form a ball having a small interface area. By "low surface energy," the angle between the solid surface and the tangent to the liquid surface at the contact point is greater than 90°, usually defined as a non-wetting surface. This may be represented by the formula cosine theta equals (solid-vapor interface energy minus solid-liquid interface energy) divided by liquid-vapor interface energy, where theta is the angle between the solid surface and the tangent to the liquid surface at the contact point. Accordingly the angle theta may also be used as measure of the surface energy.

I have discovered that the adhesion between the elastomer roll and the resin surface may be regulated or reduced to a controllable value by suitably controlling the surface energy, the surface smoothness, the pressure and the temperature in the nip, and the separation angle from the nip. I have found that highly satisfactory transparentizing can be performed by a hot-roll type glosser at satisfactory throughput speeds without permitting the resin to be cast to the surface of the elastomer roll, but merely passing it through the nip, and then releasing it immediately, by suitably controlling the exit angle.

The backing roll should be metal, and spray coated with a release coating such as Teflon, It should have a low thermal mass and a high heat transfer ability. The nip exit conditions assure that the web does not tend to follow the surface of the elastomer roll.

In connection with my investigations, I have found that transparentizing of overhead projection material, in which the substrate may be formed of PET, rather than paper, provides a more demanding test of the method and equipment. This is apparently due to the greater flatness of the substrate as compared to paper, and its greater tendency to adhere to the surface of the elastomer roll, which tendency is believed to be due, at least in part, to the exclusion of air at such surface in the nip. Further, the criticality in the percent of reduction of haze, as measured by residual haze, is more apparent in the transparentizing of projection material than that of opaque material, such as coated paper. Also, stress cracks in the coating show up as bars on the image under projection, and the employment of a method and apparatus which reduces or prevents adherence and sticking to the elastomer roll reduces stress cracking which is more critical in the OHP material. Exit tension may be controlled, to control the release angle from the nip.

As previously mentioned, the nip temperature which provides satisfactory transparentizing, is less than $T_9$ by about 10° C. to 20° C. when accompanied by a pressing force of at least about 4 lbs. per linear inch (pli) up to about 15 pli or more. Good results have been obtained in the 7–15 pli range. Pressures substantially in excess of 15 pli should be avoided, to avoid sheet wrinkling and to avoid accelerating the wear on the rolls. The elastomer roll, under these conditions, should define characteristics as set out below in terms of gloss, hardness and surface energy. For satisfactory results, the residual haze should not exceed 10% and the gloss level should be at least 70% or more, as measured, for example, by a Hunter D-48-7 glossmeter, with a surface reflectance based on a scale of zero to 100.

It is accordingly a principal object of this invention to provide method and apparatus for the glossing or transparentizing of resin coated receiver sheets or microencapsulated media material employing a heated roll-type glosser in which the nip temperature is less than the nominal glass transition temperature of the polymer resin, and in which the resin-contacting roll is formed with a high gloss low-energy surface.

Another object of the invention is the provision of a roll-type transparentizer and method having a high throughput rate for use with microcapsule type media material.

These and other objects and advantages of the invention will be apparent from the following description, the accompanying drawings, and the appended claims.

DESCRIPTION OF PREFERRED EMBODIMENTS

Figure 1:
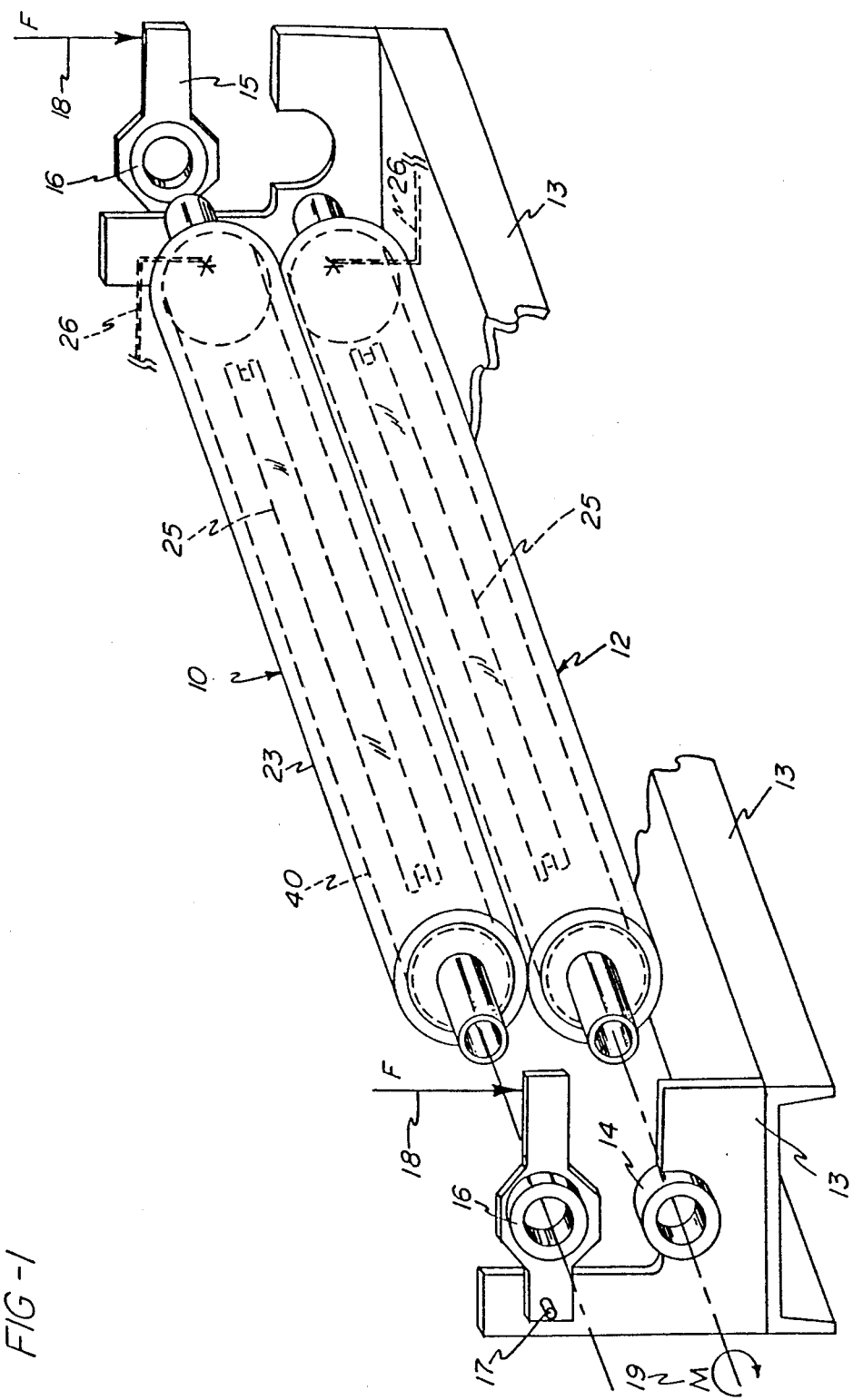
FIG. 1 is an isometric view, partially exploded, showing a two-roll glosser or transparentizing apparatus in accordance with this invention, with some of the parts being broken away.

A two-roll glosser or transparentizer, in accordance with this invention, is illustrated in FIG. 1 as including a pair of nip-forming heated cylindrical rolls. These include an upper roll 10 and a lower roll 12 in nip-forming relation. The rolls are suitably mounted for rotation on a frame 13 so that the lower roll 12 is fixedly mounted on bearings 14, while the upper roll 10 is mounted on arms 15 in bearings 16. The arms 15 are pivoted at pins 17 so that a pressing force, as represented by the arrows 18, may be adjustably applied, for controlling and adjusting the pressure in the nip. It is also understood that the force represented by the arrows 18 would normally be applied in the form of a loading spring or the like. A motor 19 may drive the roll 12 counterclockwise as viewed in FIGS. 2 and 3 with the upper roll 10 driven by friction through the nip.

Figure 2:
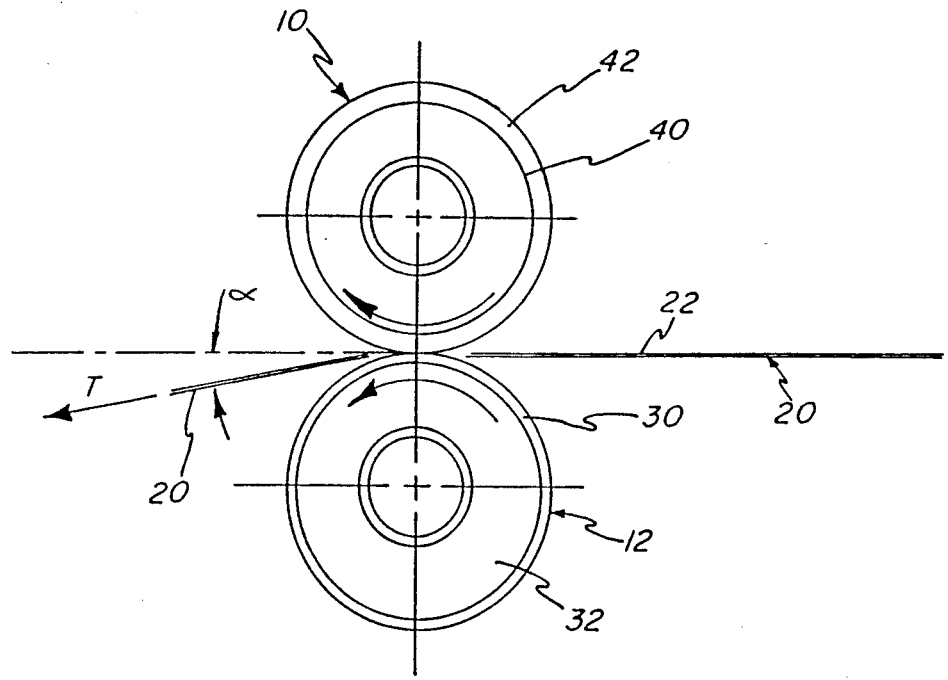
FIG. 2 is a diagrammatic end elevation of the apparatus of FIG. 1, with the end frame removed to show the roll profiles and the entrance and exit angles for the media material.

Referring to FIG. 2, the media or sheet material 20 is processed in the nip between the pair of rolls 10 and 12, with the upper or resin surface 22 in contact with the surface 23 of the upper roll 10.

The rolls 10 and 12 are preferably internally heated, and for this purpose, each roll may contain an elongated internal a quartz-type IR lamp diagrammatically illustrated at 25 in FIG. 1. The quartz lamps are operated through a temperature controller which may include a pair of surface mounted thermocouples 26 providing a suitable feedback signal to the controller.

The roll 12 may be formed with a hollow outer shell 30 carried on a pair of end discs 32. Preferably, the thermal mass of the shell 30 is relatively low and formed of material of good heat conductivity, such as aluminum. The outer surface of the shell 30 may be coated with non-stick material, such as a spray coating of Teflon, sold under the trademark SILVERSTONE by E. I. du Pont de Nemours and Company.

The characteristics of the upper roll 10 are critical to the proper performance of the apparatus and method. Primarily, the characteristics of the outer surface 23 of the roll 10 are particularly critical, to prevent adhesion or sticking of the resin with the surface, and to provide the desired glossing and transparentizing of the resin.

The surface 23 may be formed by a gloss silicone overcoat, applied to an elastomer underlayer which is in turn applied to a metal support shell. The shell is diagrammatically illustrated at 40 in FIGS. 1 and 2 and carries a silicone rubber coating on its outer surface, as illustrated by the layer 42. The main body of the layer 42 may be approximately 0.25" thick, formed with minimal waviness, such as by precision grinding.

In order to provide the necessary finish, the layer 42 is surface coated with a finish coating of silicone on the order of 0.005" thick.

This final surface coating defines the outer surface 23 of the roll 10. It is believed that the surface finish should have a smoothness in the order of 16 microinches or better and a very low surface energy on the order of 25 dynes per centimeter or less.

Another method of forming the surface 23 is to apply a gloss silicone overcoat, approximately 0.005" to 0.015" thick, directly to the metal core 40 (FIG. 2). In this case, the loss of compliance in the nip can be compensated in the design of the roll 12 (FIG. 2). These gloss silicone overcoats are typically applied by spraying methods, wherein the flow characteristics of the silicone resin are controlled to form a high gloss upon heat curing.

The force 18 is preferably adjusted to provide an optimum pressure in the nip which may be in the order of 7 pli. As previously noted, nip pressures up to about 15 pli have been found to be satisfactory. I have found that the pressing force materially aids in the transparentizing of the resin coating at temperatures less than $T_9$, using the rolls as described herein. A substantially lower force provides consistent glossing results, but requires a higher roll temperature. A substantially higher force causes undue distortion and lengthening of the nip and increases the tendency for adherence of the resin to the surface 23, may further contribute to cracking of the resin, and may cause unwanted wrinkling of paper substrates.

The surface temperature of each of the rolls 10 and 12 is substantially uniformly maintained by the internal infrared quartz lamps 25 and the thermocouples 26 so as to provide surface transparentizing temperatures at the nip which are in the range of between about 5° C. and 25° C. below $T_9$, with a preferred range of about between 10° C. to 15° C. below the glass transition temperature. With respect to the classes of resin polymers disclosed in the above-identified co-owned and co-pending applications, the glass transition temperatures fall within a range in excess of 110°, and generally between 125° C. and 130° C. With such polymers, satisfactory transparentizing and glossing has been performed on paper based media material with throughput rates of 120 inches per minute and glossing temperatures of about 120° C. Overhead projection base material (OHP) has been satisfactorily glossed with throughput rates of 50 inches per minute and a surface temperature of about 110° C. in the nip, for each of the rolls 10 and 12. In both instances, the nip pressure was about 7 pli.

It has also been discovered that it is desirable to control the exit geometry of the web sheet material 20 to assure that the sheet does not follow the surface 23 of the roll 10. For this purpose, a downward exit angle $\alpha$ of some positive value is preferred, and the angle $\alpha$ may be controlled by suitably controlling the tension T in the sheet or web material.

The maintenance of an exit angle $\alpha$, also known as a separation angle, is more critical in the transparentizing of OHP material than paper material because of the greater tendency of surface cracks to become apparent in the coated transparency material. Thus, if the angle α is too large, surface cracks can be induced. On the other hand, if the angle α is too small, random image defects can result from uncontrolled contact with the surface 23 of the upper roll 10 beyond the nip.

Figure 3:
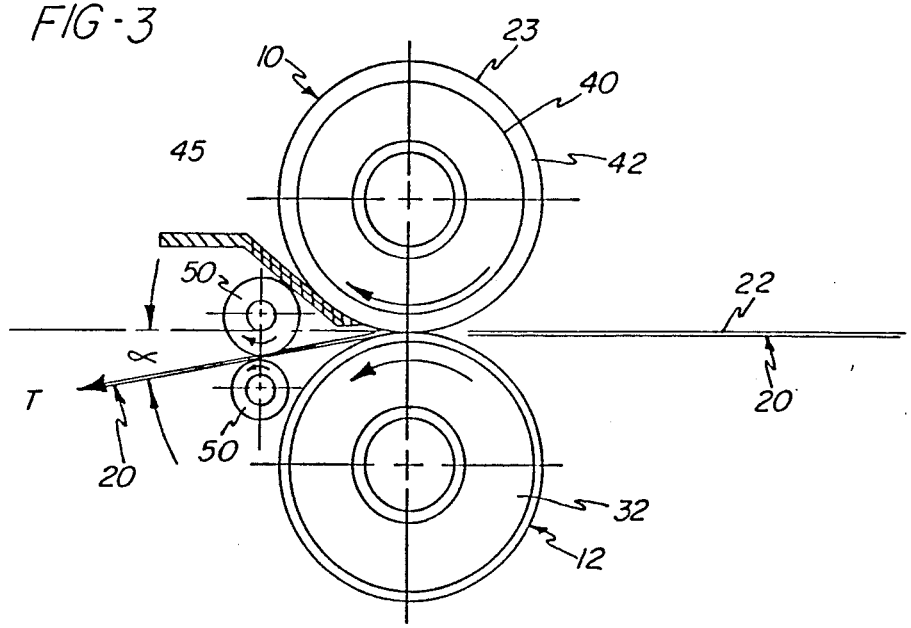
FIG. 3 is a view similar to FIG. 2 showing the addition of geometry maintaining tension rolls and a guide blade.

FIG. 3 illustrates an arrangement for maintaining the separation angle constant by maintaining a desired and constant exit tension T. First, a blade 45 may be positioned at the exit side of the nip adjacent the out-running surface of the roll 10, to serve as a doctor or deflector blade to prevent unwanted excursions of the web 20 about the circumference of the elastomer covered roll 10 at the exit side of the nip. To minimize the friction, and hence the wear, of the surface 23 on the blade 45, it may be desirable to apply a small amount of lubricant to the surface 23. This lubricant can be low viscosity silicone oil, which also enhances the release capability of the surface. The material 20 as it leaves the nip may be gripped between a pair of pull rollers 50 which provide a constant tension to the sheet or web. The rollers 50 may be driven through some suitable means, such as a slip clutch, at the same or slightly higher speed than the surface velocity of the rolls in the nip. Good results in the transparentizing of both paper and OHP materials have been achieved with an angle α of approximately 5°.

While the methods herein described constitute preferred embodiments of this invention, it is to be understood that the invention is not limited to these precise methods, and that changes may be made without departing from the scope of the invention, which is defined in the appended claims.

What is claimed is:

1. The method of transparentizing microencapsulated media material having a copolymer phenolic or vinyl glossing resin on a surface thereof with a free air glass transition temperature of $T_9$ comprising the steps of:

applying said material to the nip of a pair of rotating heated cylindrical pressing rolls in which the resin surface comes into contact with the surface of an elastomer covered roll in a nip, and in which the surface of said elastomer covered roll has a low surface energy in the order of 25 dynes per centimeter, heating said rolls to maintain a nip temperature of at least 5° C. below $T_9$, and maintaining a pressure in said nip between about 4-15 pli.

2. The method of glossing microencapsulated media sheet or web material requiring the transparentizing of a copolymer, phenolic or vinyl glossing resin on one surface of such material in which such resin has a free air gloss transition temperature of $T_9$ comprising the steps of:

applying said material to the nip of a pair of cylindrical heated pressing rolls in which one of said rolls has a low surface energy formed of a silicone elastomer of very high finish, and in which the resin surface of the material is positioned to come into contact with said low surface energy in the nip, maintaining the heat of said rolls so as to provide a nip temperature of between 5° C. and 15° C. below T , and maintaining a pressure in said nip of between about 4 and 15 pli.

3. The method of claim 2 further providing a nip separation angle at the exit side of said nip of between zero and −20° in a direction below a neutral axis and away from said elastomer surface to prevent adhesion or sticking of such material to said surface at the off-running side of the nip.

* * * * *

UNITED STATES PATENT AND TRADEMARK OFFICE
CERTIFICATE OF CORRECTION

PATENT NO. : 4,978,560
DATED : Dec. 18, 1990
INVENTOR(S) : Benjamin C. Stone

It is certified that error appears in the above-identified patent and that said Letters Patent is hereby corrected as shown below:

Col. 1, line 23, "$T_9$" should be -- $T_g$ --.

Col. 1, line 51, "s, ting" should be --setting--.

Col. 2, line 19, "$T_9$" should be --$T_g$--.

Col. 3, line 11, "$T_9$" should be --$T_g$--; line 13, "$T_9$" should be --$T_g$--; line 38, "$T_9$" should be --$T_g$--; line 44, "$T_9$" should be --$T_g$--; and line 47, "$T_9$" should be -- $T_g$ --.

Col. 4, line 49, "$T_9$" should be --$T_g$--.

Col. 6, line 43, "$T_9$" should be -- $T_g$ --.

UNITED STATES PATENT AND TRADEMARK OFFICE
CERTIFICATE OF CORRECTION

PATENT NO. : 4,978,560
DATED : Dec. 18, 1990
INVENTOR(S) : Benjamin C. Stone

It is certified that error appears in the above-identified patent and that said Letters Patent is hereby corrected as shown below:

Col. 8, line 1, "$T_9$" should be --$T_g$--;

line 11, "$T_9$" should be --$T_g$--;

line 19, "$T_9$" should be --$T_g$--; and line 28, "T ," should be --$T_g$,--.

Signed and Sealed this

Twenty-first Day of April, 1992

Attest:

HARRY F. MANBECK, JR.

*Attesting Officer*     *Commissioner of Patents and Trademarks*